(12) United States Patent
Erickson et al.

(10) Patent No.: US 11,061,645 B2
(45) Date of Patent: *Jul. 13, 2021

(54) OPTIMIZING DATA APPROXIMATION ANALYSIS USING LOW POWER CIRCUITRY

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1030 days.

This patent is subject to a terminal disclaimer.

(21) Appl. No.: 15/437,505

(22) Filed: Feb. 21, 2017

(65) Prior Publication Data

US 2018/0239586 A1    Aug. 23, 2018

(51) Int. Cl.
*G06F 7/483* (2006.01)
*G01R 31/28* (2006.01)
*G05B 19/41* (2006.01)
*G06F 7/00* (2006.01)
*G01R 19/25* (2006.01)
*H03M 1/36* (2006.01)

(52) U.S. Cl.
CPC ......... *G06F 7/483* (2013.01); *G01R 31/2851* (2013.01); *G05B 19/41* (2013.01); *G06F 7/00* (2013.01); *G01R 19/2506* (2013.01); *H03M 1/361* (2013.01)

(58) Field of Classification Search
CPC ..................................................... G06F 7/483
See application file for complete search history.

(56) References Cited

U.S. PATENT DOCUMENTS

| 4,800,518 | A  | 1/1989  | Miller |
| 5,699,389 | A  | 12/1997 | Beladi et al. |
| 7,084,695 | B2 | 8/2006  | Porter |
| 9,411,009 | B1 | 8/2016  | Aguayo Gonzalez et al. |
| 9,478,303 | B1 | 10/2016 | Parker |

OTHER PUBLICATIONS

Kozma et al., *A Low-Power Current-Mode Correlation Detector with Analog Data Storage*, 2004 IEEE Region 10 Conference (TENCON 2004), Nov. 2004, vol. 2, pp. 442-45, IEEE Xplore Digital Library (ieee.org) online, DOI: 10.1109/TENCON.2004.1414627, URL: ieeexplore.ieee.org/abstract/document/1414627/.

*Primary Examiner* — John E Breene
*Assistant Examiner* — Jeffrey C Morgan
(74) *Attorney, Agent, or Firm* — Nathan Rau

(57) ABSTRACT

Optimizing data approximation analysis using low power circuitry including receiving a plurality of data bits each corresponding to a binary indication of a test result; placing each of the plurality of data bits on an approximation circuit, wherein each of the data bits is placed on the approximation circuit by applying, to a first capacitor during a set time period, a voltage corresponding to the data bit, and wherein placing each of the plurality of data bits on the approximation circuit results in a resulting voltage stored on the first capacitor; and determining a potential correlation of the test results by comparing the resulting voltage to a voltage threshold.

20 Claims, 6 Drawing Sheets

OPTIMIZING DATA APPROXIMATION ANALYSIS USING LOW POWER CIRCUITRY

BACKGROUND

Field of the Invention

The field of the invention is data processing, or, more specifically, methods, apparatus, and products for optimizing data approximation analysis using low power circuitry.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for optimizing data approximation analysis using low power circuitry are disclosed in this specification. Optimizing data approximation analysis using low power circuitry includes receiving a plurality of data bits each corresponding to a binary indication of a test result; placing each of the plurality of data bits on an approximation circuit, wherein each of the data bits is placed on the approximation circuit by applying, to a first capacitor during a set time period, a voltage corresponding to the data bit, and wherein placing each of the plurality of data bits on the approximation circuit results in a resulting voltage stored on the first capacitor; and determining a potential correlation of the test results by comparing the resulting voltage to a voltage threshold.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
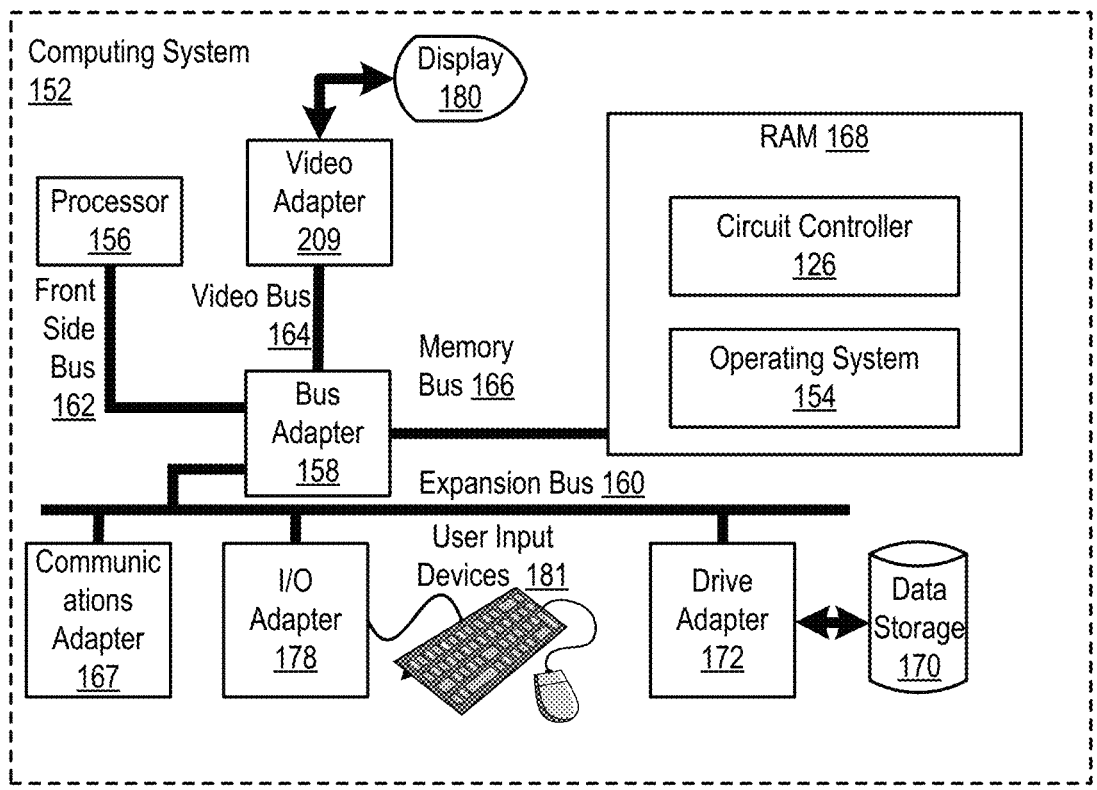
FIG. 1 sets forth a block diagram of an example system configured for optimizing data approximation analysis using low power circuitry according to embodiments of the present invention.

Exemplary methods, apparatus, and products for optimizing data approximation analysis using low power circuitry in accordance with the present invention are described with reference to the accompanying drawings, beginning with FIG. 1. FIG. 1 sets forth a block diagram of automated computing machinery comprising an exemplary computing system (152) configured for optimizing data approximation analysis using low power circuitry according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for optimizing data approximation analysis using low power circuitry according to embodiments of the present invention include UNIX™, Linux™, Microsoft XP™, AIX™, IBM's iOS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a circuit controller (126), a module of computer program instructions for optimizing data approximation analysis using low power circuitry.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for optimizing data approximation analysis using low power circuitry according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for optimizing data approximation analysis using low power circuitry according to embodiments of the present invention include modems for wired dial-up communications, Ethernet (IEEE 802.3) adapters for wired data communications, and 802.11 adapters for wireless data communications.

Figure 2:
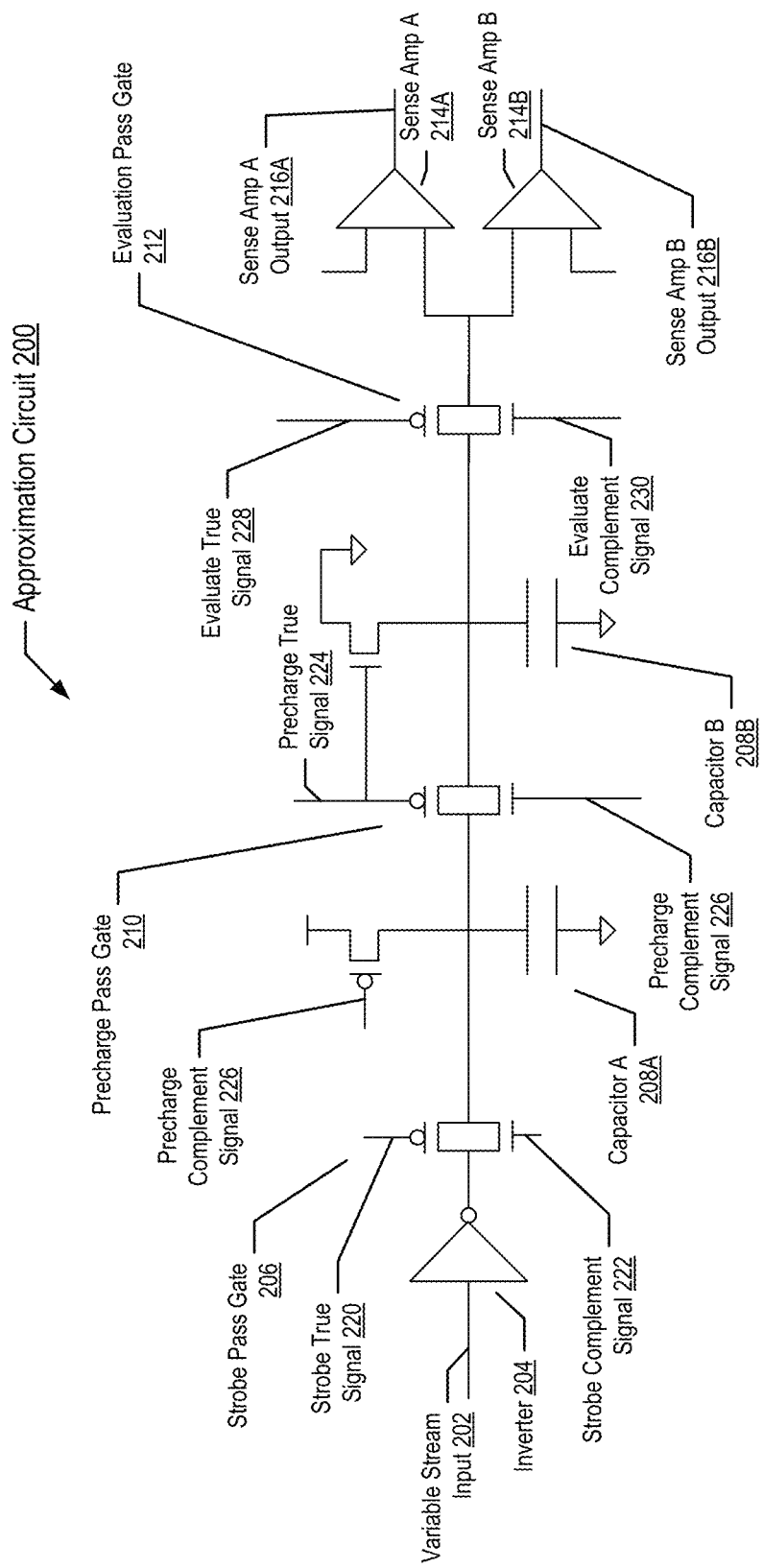
FIG. 2 sets forth a circuit configured for optimizing data approximation analysis using low power circuitry according to embodiments of the present invention.

FIG. 2 shows elements of an example approximation circuit (200) configured for optimizing data approximation analysis using low power circuitry in accordance with the present invention. As shown in FIG. 2, the exemplary approximation circuit (200) includes a variable stream input (202) line, an inverter (204), a strobe pass gate (206), two capacitors (capacitor A (208A), capacitor B (208B)), a precharge pass gate (210), an evaluation pass gate (212), two sense amps (sense amp A (214A), sense amp B (214B)), and two sense amp outputs (sense amp A output (216A), sense amp B output (216B)).

The variable stream input (202) line is a pin or other input wire configured to receive a stream of test results in the form of data bits. The data bits may be received as voltages corresponding to high data bits and low data bits. Further, the variable stream input (202) may receive a very large data set comprising hundreds, thousands, or millions of data bits in a very short time period. Each data bit in the data set may represent a test result in the form of a high bit (pass) or a low bit (fail). Further, the data set may represent a same test performed under different conditions. The test may be, for example, a test of an element within a chip or die, such as a contact via resistance test. The different conditions may be, for example, different non-yielding chips or dies.

The inverter (204) may receive the data bits on the variable stream input (202) line and place those data bits on the approximation circuit (200) in an appropriate form. For example, the inverter (204) may convert a negative voltage to a positive voltage for storage by the capacitors and measurement by the sense amps.

The strobe pass gate (206) controls the amount of time that the voltage for a data bit is permitted to charge the capacitor. For each data bit received, the strobe pass gate (206) applies the corresponding voltage to the capacitors over a set time period. The capacitors (capacitor A (208A), capacitor B (208B)) store a voltage for the data set that is the combined voltages applied from each data bit applied to the approximation circuit. The approximation circuit (200) may incorporate two capacitors to operate as a single capacitor. Two capacitors may be incorporated, in part, for an efficient application of a midpoint voltage. The strobe pass gate (206) is operated using the strobe true signal (220) and the strobe complement signal (222).

The inverter (204) may be a high impedance inverter such that a received data bit will cause a specific amount of output charge over a specific time period. Such an output charge may be small relative to the circuit voltage (i.e., the maximum expected voltage on the capacitor). Additionally, or alternatively, the strobe pass gate (206) may be a current-limiting pass gate that, for a given input data bit, outputs a specific amount of output charge over a specific time period. The output charge and output rate may be programmed into the inverter (204) and/or the strobe pass gate (206).

The precharge pass gate (210) controls the voltage transfer between the capacitors during the precharge process. When closed, precharge pass gate (210) allows a voltage to be applied to only one capacitor (or one side of the precharge pass gate (210)). When open, the precharge pass gate (210) allows the voltage to transfer from one capacitor to another such that the voltages on both capacitors equalizes to a midpoint voltage that is half of the voltage applied to the first capacitor (assuming no voltage on the second capacitor prior to opening the precharge pass gate (210)). The precharge pass gate (210) is operated using the precharge true signal (224) and the precharge complement signal (226).

The evaluation pass gate (212), when open, allows the resulting voltage to transfer from the capacitors (capacitor A (208A), capacitor B (208B)) to transfer to the sense amps (sense amp A (214A), sense amp B (214B)). The sense amps (sense amp A (214A), sense amp B (214B)) compare the resulting voltage to a voltage threshold, and outputs, on the sense amp outputs (sense amp A output (216A), sense amp B output (216B)) a potential correlation that indicates whether the voltage threshold is exceeded by the resulting voltage. The evaluate pass gate (212) is operated using the evaluate true signal (228) and the evaluate complement signal (230).

Each sense amp ((sense amp A (214A), sense amp B (214B)) may be programmed to a different threshold voltage, and may therefore generate a different potential correlation indication. For example, sense amp A (214A) may compare the resulting voltage to a voltage threshold of 80% of the maximum expected voltage. If the resulting voltage is greater than the voltage threshold, the potential correlation on the sense amp A output (216A) will indicate that the threshold has been exceeded. Similarly, sense amp B (214A) may compare the resulting voltage to a voltage threshold of 20% of the maximum expected voltage. If the resulting voltage is lower than the voltage threshold, the potential correlation on the sense amp B output (216B) will indicate that the threshold has not been exceeded.

Figure 3:
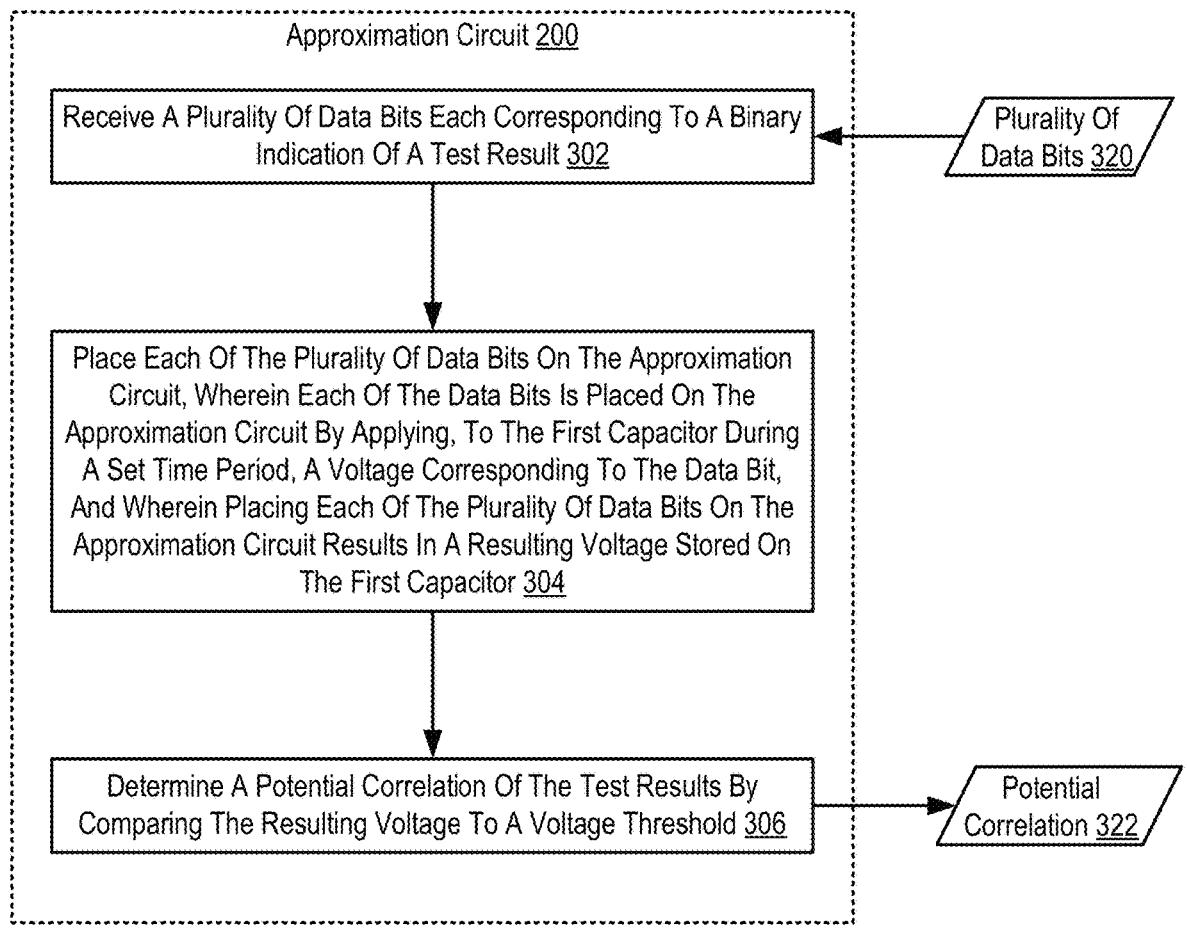
FIG. 3 sets forth a flow chart illustrating an exemplary method for optimizing data approximation analysis using low power circuitry according to embodiments of the present invention.

For further explanation, FIG. 3 sets forth a flow chart illustrating an exemplary method for optimizing data approximation analysis using low power circuitry according to embodiments of the present invention that includes receiving (302) a plurality of data bits (320) each corresponding to a binary indication of a test result. Receiving (302) a plurality of data bits (320) each corresponding to a binary indication of a test result may be carried out by applying a test result output to the variable stream input. The plurality of data bits (320) may be received as a data set of test results from a same test performed under different conditions. For example, a set of non-yielding dies may undergo a test targeting one circuit within the die. The results of each circuit test on each non-yielding die may be received by the approximation circuit (200) as a plurality of data bits (320). The test result output may be transmitted to the approximation circuit (200) by a circuit controller.

The method of FIG. 3 also includes placing (304) each of the plurality of data bits on an approximation circuit (200), wherein each of the data bits is placed on the approximation circuit by applying, to a first capacitor during a set time period, a voltage corresponding to the data bit, and wherein placing each of the plurality of data bits on the approximation circuit (200) results in a resulting voltage stored on the first capacitor. Placing (304) each of the plurality of data bits on an approximation circuit (200), wherein each of the data bits is placed on the approximation circuit by applying, to a first capacitor during a set time period, a voltage corresponding to the data bit, and wherein placing each of the plurality of data bits on the approximation circuit (200) results in a resulting voltage stored on the first capacitor may be carried out by the inverter transmitting each data bit to a strobe pass gate on the approximation circuit (200). The size of the resulting voltage may correspond to the number of passing test results relative to all test results received as data bits.

Applying, to a first capacitor during a set time period, a voltage corresponding to the data bit may be performed by the strobe pass gate. The set time period may be controlled by a strobe pass gate coupled to the first capacitor. The strobe pass gate may be programmed with the set time period to apply each voltage (corresponding to each data bit) to the capacitor. The programmed set time may be dependent upon the number of data bits in the plurality of data bits and/or the size of the first capacitor.

For example, a first data bit may have a corresponding voltage applied to the approximation circuit via an inverter and received by the strobe pass gate. The strobe pass gate applies a voltage to the first capacitor for a set time period, then receives a second data bit and applies another voltage to the first capacitor for the same set time period. This continues until each data bit in the plurality of data bits has been processed.

The method of FIG. 3 also includes determining (306) a potential correlation (322) of the test results by comparing the resulting voltage to a voltage threshold. Determining (306) a potential correlation (322) of the test results by comparing the resulting voltage to a voltage threshold may be carried out by generating a potential correlation (322) signal based on the outcome of a comparison of the resulting voltage to a voltage threshold. The potential correlation (322) is information or signals that may indicate whether a series of test results warrants further investigation. Specifically, the potential correlation may indicate a percentage of passing test results. The potential correlation (322) may be a binary indication of whether the percent of passing test is above or below a threshold. The potential correlation (322) may be transmitted to the circuit controller.

For example, the approximation circuit may be configured to quickly and efficiently evaluate test results from chip yields. A particular test may be performed on a group of non-yielding computer chips to determine which element or elements within the chips may have resulted in the chips overall failure. The set of test results for the group of non-yielding chip may be received on a variable stream input line and received by an inverter. Once the capacitor within the approximation circuit has been precharged to a midpoint voltage, each of the data bits are placed, serially, on the approximation circuit by a strobe pass gate applying, to the capacitor, a voltage corresponding to the data bit. Once the voltages for each data bit have been applied, the potential correlation of the test results is determined by comparing the resulting voltage from the capacitor to a threshold voltage. For example, if less than 20% of the test results are passing test results, the element undergoing the test may be the source of the die failures. Therefore, the approximation circuit may be configured to output a potential correlation (322) indication if the passing test results are less than a 20% threshold.

Figure 4:
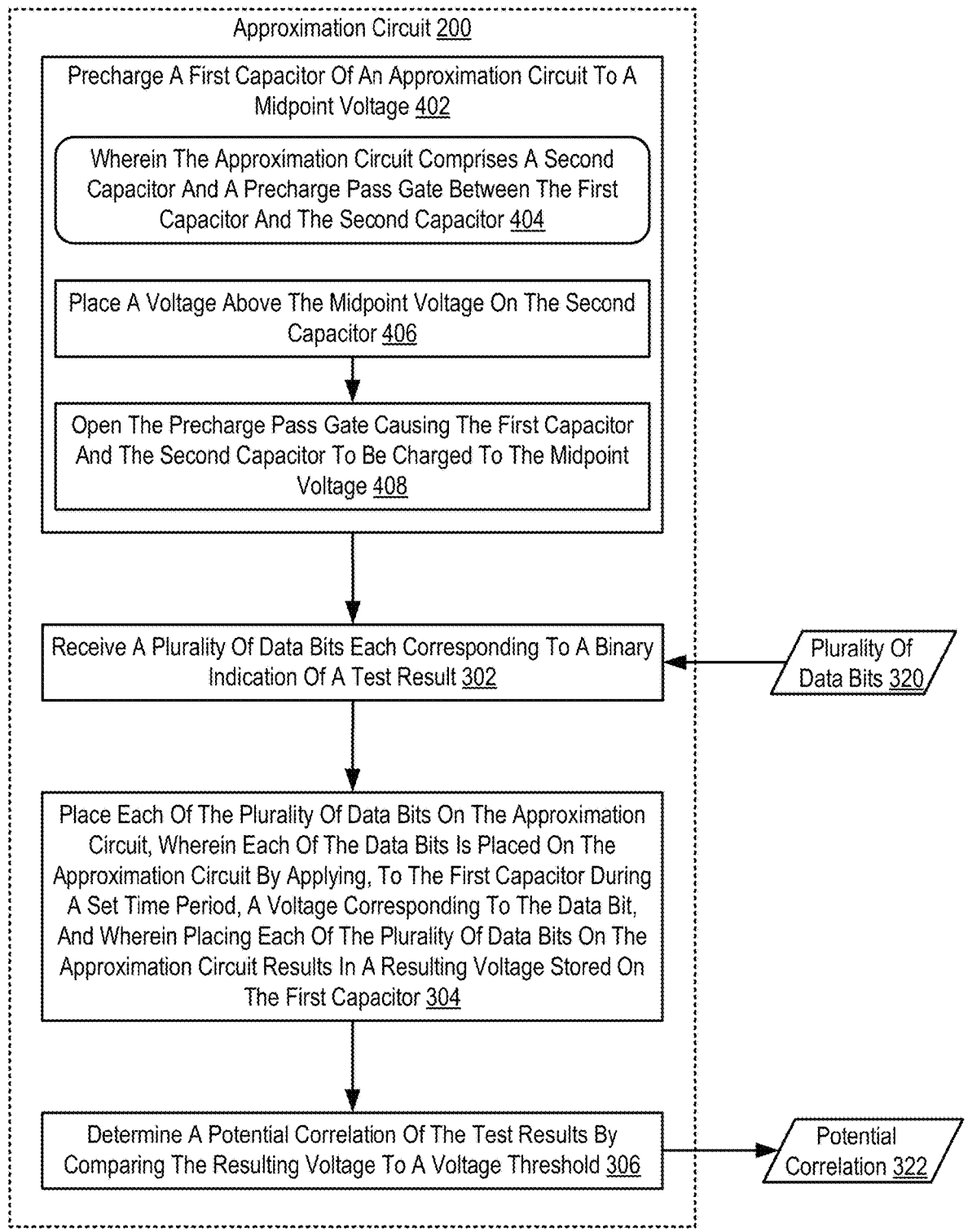
FIG. 4 sets forth a flow chart illustrating an exemplary method for optimizing data approximation analysis using low power circuitry according to embodiments of the present invention.

For further explanation, FIG. 4 sets forth a flow chart illustrating a further exemplary method for optimizing data approximation analysis using low power circuitry according to embodiments of the present invention that includes receiving (302) a plurality of data bits (320) each corresponding to a binary indication of a test result; placing (304) each of the plurality of data bits on an approximation circuit (200), wherein each of the data bits is placed on the approximation circuit by applying, to a first capacitor during a set time period, a voltage corresponding to the data bit, and wherein placing each of the plurality of data bits on the approximation circuit (200) results in a resulting voltage stored on the first capacitor; and determining (306) a potential correlation (322) of the test results by comparing the resulting voltage to a voltage threshold.

The method of FIG. 4 differs from the method of FIG. 3, however, in that, prior to receiving (302) a plurality of data bits (320) each corresponding to a binary indication of a test result, FIG. 4 includes precharging (402) a first capacitor of an approximation circuit (200) to a midpoint voltage. Precharging (402) a first capacitor of an approximation circuit (200) to a midpoint voltage may be carried out by placing a voltage on the first capacitor that is equal to one half of a circuit voltage. The circuit voltage is a maximum expected voltage on the capacitor. The circuit voltage may be equal to the voltage expected if every data bit of the plurality of data bits received and stored on the first capacitor were up bits (i.e., '1's). The strobe pass gate and the evaluate pass gate may be closed (i.e., 'high') during the precharging of the first capacitor.

Precharging (402) a first capacitor of an approximation circuit (200) to a midpoint voltage also includes wherein (404) the approximation circuit (200) comprises a second capacitor and a precharge pass gate between the first capacitor and the second capacitor. The approximation circuit (200) may incorporate two or more capacitors separated by a precharge pass gate.

Precharging (402) a first capacitor of an approximation circuit (200) to a midpoint voltage also includes placing (406) a voltage above the midpoint voltage on the second capacitor. Placing (406) a voltage above the midpoint voltage on the second capacitor may be carried out by closing the precharge pass gate, and charging the second capacitor to voltage that is twice the desired midpoint voltage. The voltage above the midpoint voltage may be an expect maximum voltage on the capacitor if each of the plurality of data bits have been processed and are all passing test results.

Precharging (402) a first capacitor of an approximation circuit (200) to a midpoint voltage also includes opening (408) the precharge pass gate causing the first capacitor and the second capacitor to be charged to the midpoint voltage. Opening (408) the precharge pass gate causing the first capacitor and the second capacitor to be charged to the midpoint voltage may be carried out by setting the precharge pass gate to low allowing the voltage from the second capacitor to charge the first capacitor. The first capacitor and the second capacitor will equalize at one half the charge placed on the second capacitor (assuming no voltage charge on the first capacitor).

Precharging (402) a first capacitor of an approximation circuit (200) to a midpoint voltage may be unnecessary for certain groups of data bits. Depending on the characteristics of the plurality of data bits (320) (e.g., for very large data sets), a resulting voltage and potential correlation (322) may be generated without precharging the first capacitor to a midpoint voltage. In order to determine a potential correlation (322) from a resulting voltage without precharging the first capacitor, the resulting voltage may require a time threshold (e.g., a threshold number of seconds, a threshold number of cycles) based on the plurality of data bits (320). Specifically, determining (306) a potential correlation of the test results by comparing the resulting voltage to a voltage threshold may include evaluating the resulting voltage after a time threshold has been exceeded. A time threshold may be utilized regardless of whether or not the capacitor or capacitors are precharged to a midpoint voltage.

Figure 5:
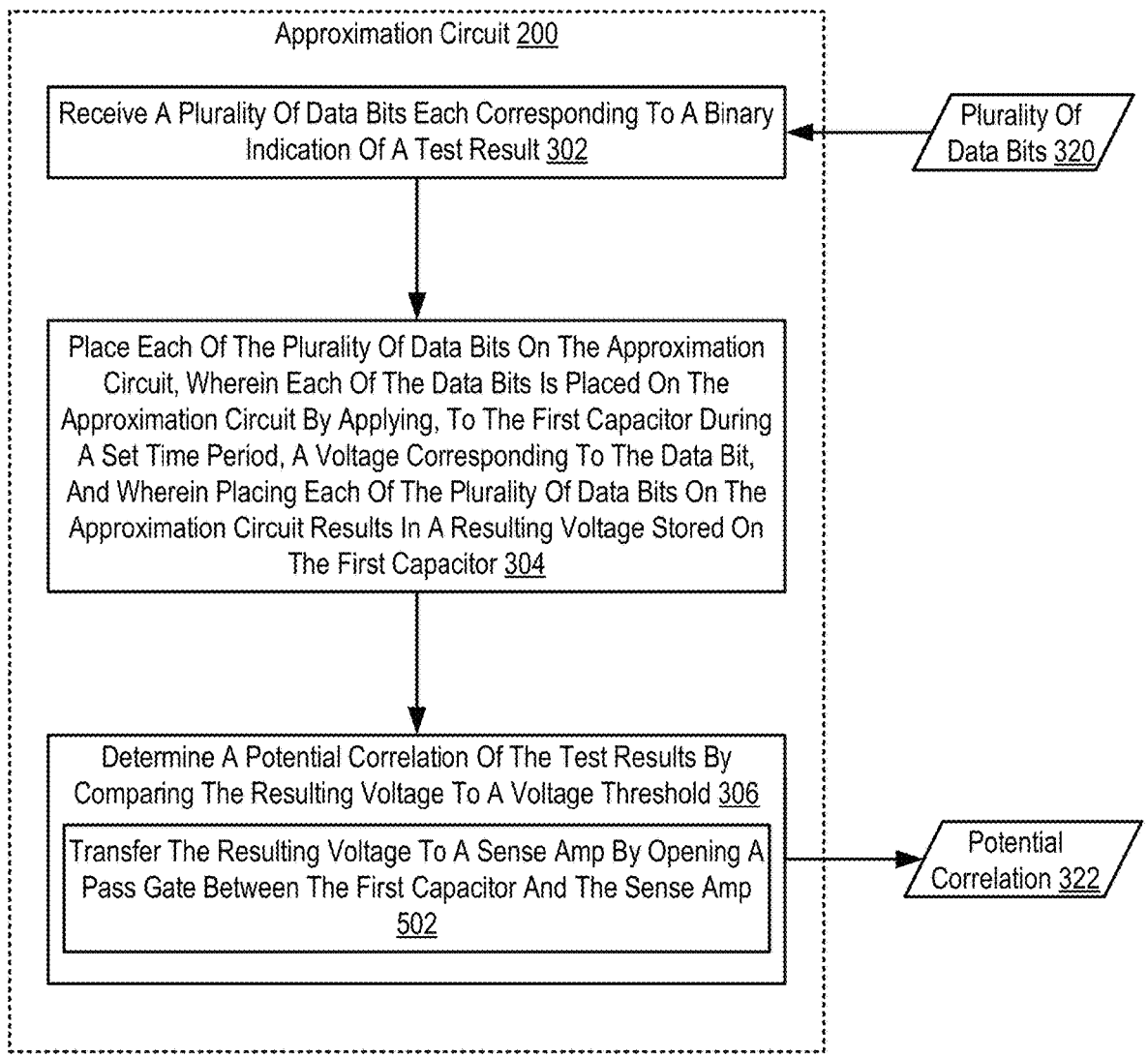
FIG. 5 sets forth a flow chart illustrating an exemplary method for optimizing data approximation analysis using low power circuitry according to embodiments of the present invention.

For further explanation, FIG. 5 sets forth a flow chart illustrating a further exemplary method for optimizing data approximation analysis using low power circuitry according to embodiments of the present invention that includes receiving (302) a plurality of data bits (320) each corresponding to a binary indication of a test result; placing (304) each of the plurality of data bits on an approximation circuit (200), wherein each of the data bits is placed on the approximation circuit by applying, to a first capacitor during a set time period, a voltage corresponding to the data bit, and wherein placing each of the plurality of data bits on the approximation circuit (200) results in a resulting voltage stored on the first capacitor; and determining (306) a potential correlation (322) of the test results by comparing the resulting voltage to a voltage threshold.

The method of FIG. 5 differs from the method of FIG. 3, however, in that determining (306) a potential correlation (322) of the test results by comparing the resulting voltage to a voltage threshold includes transferring (502) the resulting voltage to a sense amp by opening a pass gate between the first capacitor and the sense amp. Transferring (502) the resulting voltage to a sense amp by opening a pass gate between the first capacitor and the sense amp may be carried out by setting an evaluation pass gate to low transferring the resulting voltage on the capacitor or capacitors to one or more sense amps.

Figure 6:
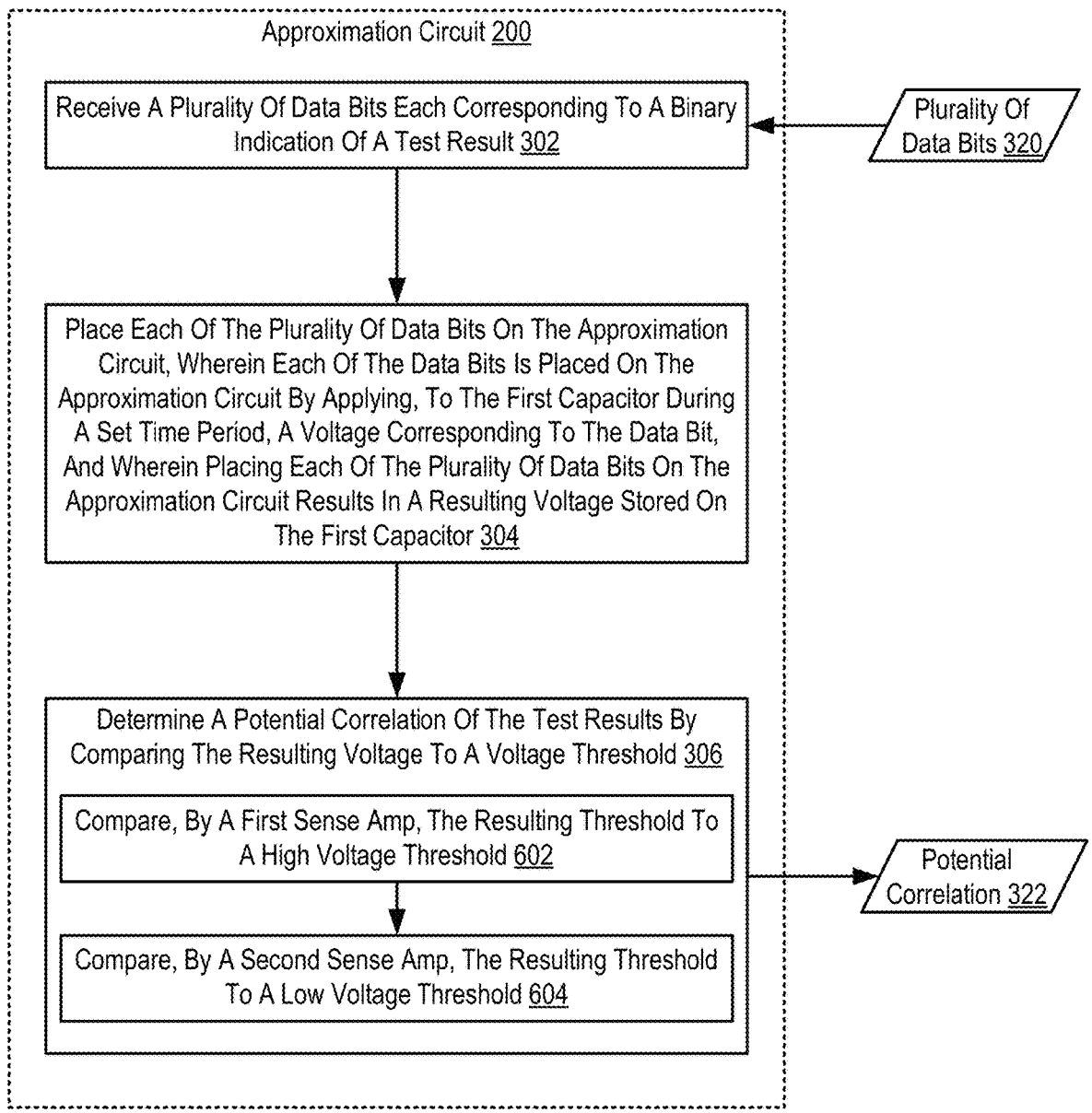
FIG. 6 sets forth a flow chart illustrating an exemplary method for optimizing data approximation analysis using low power circuitry according to embodiments of the present invention.

For further explanation, FIG. 6 sets forth a flow chart illustrating a further exemplary method for optimizing data approximation analysis using low power circuitry according to embodiments of the present invention that includes receiving (302) a plurality of data bits (320) each corresponding to a binary indication of a test result; placing (304) each of the plurality of data bits on an approximation circuit (200), wherein each of the data bits is placed on the approximation circuit by applying, to a first capacitor during a set time period, a voltage corresponding to the data bit, and wherein placing each of the plurality of data bits on the approximation circuit (200) results in a resulting voltage stored on the first capacitor; and determining (306) a potential correlation (322) of the test results by comparing the resulting voltage to a voltage threshold.

The method of FIG. 6 differs from the method of FIG. 3, however, in that determining (306) a potential correlation (322) of the test results by comparing the resulting voltage to a voltage threshold includes comparing (602), by a first sense amp, the resulting threshold to a high voltage threshold. Comparing (602), by a first sense amp, the resulting threshold to a high voltage threshold may be carried out by the first sense amp receiving the resulting voltage and a high threshold voltage and determining which voltage is higher. The sense amp may send, on a sense amp output line, a potential correlation (322) that indicates whether the resulting voltage is higher than the high threshold voltage. The high threshold voltage may be a voltage set to an expected resulting voltage if a particular percentage (e.g., 80%) of the data bits are '1's (indicating a passing test result). Therefore, exceeding the high threshold voltage by the resulting voltage indicates that the number of passing test results is above a percentage threshold corresponding to the high voltage threshold.

The method of FIG. 6 also differs from the method of FIG. 3, however, in that determining (306) a potential correlation (322) of the test results by comparing the resulting voltage to a voltage threshold includes comparing (604), by a second sense amp, the resulting threshold to a low voltage threshold. Comparing (604), by a second sense amp, the resulting threshold to a low voltage threshold may be carried out by the first sense amp receiving the resulting voltage and a low threshold voltage and determining which voltage is higher. The sense amp may send, on a sense amp output line, a potential correlation (322) that indicates whether the resulting voltage is lower than the low threshold voltage. The low threshold voltage may be a voltage set to an expected resulting voltage if a particular percentage (e.g., 20%) of the data bits are '1's (indicating a passing test result). Therefore, failing to exceed the low threshold voltage by the resulting voltage indicates that the number of passing test results is below a percentage threshold corresponding to the low voltage threshold.

In view of the explanations set forth above, readers will recognize that the benefits of optimizing data approximation analysis using low power circuitry according to embodiments of the present invention include:

Utilizing custom circuits to perform near-real-time analysis of test results that is orders of magnitude more efficient than traditional methods and requires less time.

Utilizing custom circuits to quickly and efficiently evaluate large amounts of data to approximate trends and flag anomalies, increasing data evaluation efficiency.

Exemplary embodiments of the present invention are described largely in the context of a fully functional computer system for optimizing data approximation analysis using low power circuitry. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of optimizing data approximation analysis using low power circuitry comprising:
   receiving a plurality of data bits each corresponding to a binary indication of a test result;
   placing each of the plurality of data bits on an approximation circuit, wherein each of the data bits is placed on the approximation circuit by applying, to a first capacitor during a set time period, a voltage corresponding to the data bit, and wherein placing each of the plurality of data bits on the approximation circuit results in a resulting voltage stored on the first capacitor; and determining a potential correlation of the test results by comparing the resulting voltage to a voltage threshold.

2. The method of claim 1, wherein prior to placing each of the plurality of data bits on the approximation circuit:
precharging the first capacitor of the approximation circuit to a midpoint voltage.

3. The method of claim 2, wherein the approximation circuit comprises a second capacitor and a precharge pass gate between the first capacitor and the second capacitor, and wherein precharging the first capacitor of the approximation circuit to the midpoint voltage comprises:
placing a voltage above the midpoint voltage on the second capacitor; and
opening the precharge pass gate causing the first capacitor and the second capacitor to be charged to the midpoint voltage.

4. The method of claim 1, wherein comparing the resulting voltage to the voltage threshold comprises:
transferring the resulting voltage to a sense amp by opening a pass gate between the first capacitor and the sense amp.

5. The method of claim 1, wherein comparing the resulting voltage to the voltage threshold comprises:
comparing, by a first sense amp, the resulting threshold to a high voltage threshold; and
comparing, by a second sense amp, the resulting threshold to a low voltage threshold.

6. The method of claim 1, wherein the set time period is controlled by a strobe pass gate coupled to the first capacitor.

7. The method of claim 1, wherein each data bit of the plurality of data bits corresponds to a test result from a same test performed under different conditions, and wherein the potential correlation indicates a percentage of passing test results.

8. An apparatus for optimizing data approximation analysis using low power circuitry, the apparatus comprising an approximation circuit configured to carry out the steps of:
receiving a plurality of data bits each corresponding to a binary indication of a test result;
placing each of the plurality of data bits on an approximation circuit, wherein each of the data bits is placed on the approximation circuit by applying, to a first capacitor during a set time period, a voltage corresponding to the data bit, and wherein placing each of the plurality of data bits on the approximation circuit results in a resulting voltage stored on the first capacitor; and
determining a potential correlation of the test results by comparing the resulting voltage to a voltage threshold.

9. The apparatus of claim 8, wherein prior to placing each of the plurality of data bits on the approximation circuit:
precharging the first capacitor of the approximation circuit to a midpoint voltage.

10. The apparatus of claim 9, wherein the approximation circuit comprises a second capacitor and a precharge pass gate between the first capacitor and the second capacitor, and wherein precharging the first capacitor of the approximation circuit to the midpoint voltage comprises:
placing a voltage above the midpoint voltage on the second capacitor; and
opening the precharge pass gate causing the first capacitor and the second capacitor to be charged to the midpoint voltage.

11. The apparatus of claim 8, wherein comparing the resulting voltage to the voltage threshold comprises:
transferring the resulting voltage to a sense amp by opening a pass gate between the first capacitor and the sense amp.

12. The apparatus of claim 8, wherein comparing the resulting voltage to the voltage threshold comprises:
comparing, by a first sense amp, the resulting threshold to a high voltage threshold; and
comparing, by a second sense amp, the resulting threshold to a low voltage threshold.

13. The apparatus of claim 8, wherein the set time period is controlled by a strobe pass gate coupled to the first capacitor.

14. The apparatus of claim 8, wherein each data bit of the plurality of data bits corresponds to a test result from a same test performed under different conditions, and wherein the potential correlation indicates a percentage of passing test results.

15. A computer program product for optimizing data approximation analysis using low power circuitry, the computer program product disposed upon a non-transitory computer readable medium, the computer program product comprising computer program instructions that, when executed, cause a computer to carry out the steps of:
receiving a plurality of data bits each corresponding to a binary indication of a test result;
placing each of the plurality of data bits on an approximation circuit, wherein each of the data bits is placed on the approximation circuit by applying, to a first capacitor during a set time period, a voltage corresponding to the data bit, and wherein placing each of the plurality of data bits on the approximation circuit results in a resulting voltage stored on the first capacitor; and
determining a potential correlation of the test results by comparing the resulting voltage to a voltage threshold.

16. The computer program product of claim 15, wherein prior to placing each of the plurality of data bits on the approximation circuit:
precharging the first capacitor of the approximation circuit to a midpoint voltage.

17. The computer program product of claim 16, wherein the approximation circuit comprises a second capacitor and a precharge pass gate between the first capacitor and the second capacitor, and wherein precharging the first capacitor of the approximation circuit to the midpoint voltage comprises:
placing a voltage above the midpoint voltage on the second capacitor; and
opening the precharge pass gate causing the first capacitor and the second capacitor to be charged to the midpoint voltage.

18. The computer program product of claim 15, wherein comparing the resulting voltage to the voltage threshold comprises:
transferring the resulting voltage to a sense amp by opening a pass gate between the first capacitor and the sense amp.

19. The computer program product of claim 15, wherein comparing the resulting voltage to the voltage threshold comprises:
comparing, by a first sense amp, the resulting threshold to a high voltage threshold; and comparing, by a second sense amp, the resulting threshold to a low voltage threshold.

20. The computer program product of claim 15, wherein the set time period is controlled by a strobe pass gate coupled to the first capacitor.

\* \* \* \* \*